United States Patent
Marsh et al.

(10) Patent No.: US 7,560,966 B2
(45) Date of Patent: Jul. 14, 2009

(54) METHOD OF TESTING CONNECTIVITY USING DUAL OPERATIONAL MODE CML LATCH

(75) Inventors: Joseph O. Marsh, Poughkeepsie, NY (US); Joseph Natonio, Wappingers Falls, NY (US); James M. Wilson, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/002,878

(22) Filed: Dec. 19, 2007

(65) Prior Publication Data

US 2008/0129329 A1 Jun. 5, 2008

Related U.S. Application Data

(62) Division of application No. 11/307,923, filed on Feb. 28, 2006, now Pat. No. 7,358,787.

(51) Int. Cl.
*H03K 3/289* (2006.01)

(52) U.S. Cl. .................. 327/202; 327/211; 714/726; 714/727

(58) Field of Classification Search ............. 327/202, 327/211; 714/726, 727
See application file for complete search history.

(56) References Cited

U.S. PATENT DOCUMENTS

| 4,274,017 A | | 6/1981 | Carter et al. | |
|---|---|---|---|---|
| 4,580,066 A | * | 4/1986 | Berndt | 327/197 |
| 4,920,282 A | * | 4/1990 | Muraoka et al. | 327/218 |
| 6,000,051 A | * | 12/1999 | Nadeau-Dostie et al. | 714/727 |
| 6,850,104 B2 | | 2/2005 | Fattaruso | |
| 7,080,299 B2 | * | 7/2006 | McLaurin | 714/726 |

OTHER PUBLICATIONS

SE Bello et al., "Hybrid Differential Cascode Current Switch Shift Register Latch," *IBM Technical Disclosure Bulletin*, Jul. 1987, pp. 864-866.

* cited by examiner

*Primary Examiner*—Kenneth B. Wells
(74) *Attorney, Agent, or Firm*—Steven Capella; Daryl Neff

(57) ABSTRACT

A method of testing connectivity through a plurality of dual purpose current mode logic ("CML") latch circuits connected in a series is provided. Each of the CML latch circuits are operable to latch at least one output signal at a timing in accordance with at least one clock signal and having a mode control device for operating the CML latch circuit as a buffer amplifier when the at least one clock signal is inactive. The method comprises the steps of activating the mode control devices of each of the CML latches to operate each of the CML latches as a buffer; inputting a first signal to a first CML latch of the series; latching an output signal of a second CML latch of the series, the second CML latch being connected at a point in the series downstream from the first CML latch; and determining whether the output signal changes in accordance with a change in the first signal.

3 Claims, 7 Drawing Sheets

METHOD OF TESTING CONNECTIVITY USING DUAL OPERATIONAL MODE CML LATCH

CROSS-REFERENCE TO RELATED APPLICATION

This application is a divisional of U.S. patent application Ser. No. 11/307,923 filed Feb. 28, 2006, now U.S. Pat. No. 7,358,787, the disclosure of which is hereby incorporated herein by reference.

BACKGROUND OF THE INVENTION

The invention relates to latch circuits, and more particularly to a method of testing connectivity using latch signals which are transmitted as differential pairs of signals.

Latches take a variety of forms and are used in a variety of applications. Latches are basic building blocks of many types of sequential digital circuits including flip-flops, registers, adders, multipliers, etc., and are used at interfaces between digital circuits and analog circuits. In its simplest form, a binary digital latch is implemented by a circuit which generates an output signal having one of two binary states determined in accordance with a state of at least one input signal. A clock signal times the operation of the binary latch such that the output signal transitions between states at times determined in accordance with the clock signal.

A current mode logic ("CML") latch is a particular type of latch which is usable when signals are transmitted as differential pairs of signals. Signals transmitted at relatively high frequencies require noise rejection to a greater degree than signals transmitted at lower frequencies. One way to achieve greater noise rejection is to transmit one signal differentially as a pair of signals which have opposite states. In each such pair, the differential signals either remain together at their respective opposite states or swing between the opposite states simultaneously. Data-carrying signals are input to a CML latch as a pair of differential data signals. Clock signals are input to the CML latch as a pair of differential clock signals. A CML latch rejects noise that affects (e.g., slows, advances, raises or lowers) both of the differential signals in the same way so as to latch the output signal reliably at a correct state despite noise affecting the differentially transmitted pair of signals. With differential signal transmission, even in the presence of noise, the differential clock signals accurately time the operation of the CML latch and the CML correctly latches the states of the differential data signals.

FIG. 1 is a schematic diagram illustrating a CML latch 100 in accordance with the prior art. As illustrated in FIG. 1, the CML latch 100 includes a first input device 102 and a second input device 104, the first and second input devices being operable to receive first and second differentially transmitted input signals AP and AN, respectively. A first tail device 110 controls the flow of current between the first and second input devices and a current source 114 which is connected to ground. The first and second input devices 102, 104 become active when one clock signal CP input to the first tail device 110 is active. Such clock signal CP is one of a pair of differential clock signals CP and CN having phases 180 degrees apart, the clock signals swinging simultaneously between opposite levels. The differential clock signals operate at a relatively high frequency, such as a frequency of a few hundred megahertz (MHz) to several gigahertz (GHz) or tens of gigahertz.

When clock signal CP is active, one of the first and second input devices conducts a current I1 or I2, respectively, in accordance with the states of the first and second input signals AP and AN, respectively. The states of output signals ZP and ZN change according to the currents I1 and I2 across loads L1 and L2, respectively. In such way, when input signal AP is active, current I1 across load L1 pulls down the voltage at node ZN such that the output signal ZN becomes low. The input signal AN at such time is inactive, causing input device 104 to be turned off. In that case, current I2 does not flow and the output signal at node ZP remains high. On the other hand, when input signal AN is active, current I2 across load L2 pulls down the voltage at node ZP such that the output signal ZP becomes low. At such time, the input signal AP is inactive, causing input device 102 to be turned off such that current I1 does not flow and the output signal at node ZN remains high.

A pair of cross-coupled devices 106 and 108 are operable to latch the output signals ZP and ZN when the differential clock signal CN is active. When clock signal CP is active, the clock signal CN is inactive, such that output signals ZP and ZN change when the input signals AN and AP change. On the other hand, when clock signal CP is inactive and the clock signal CN is active, the cross-coupled devices 106, 108 latch the current states of the output signals ZP and ZN and hold them until clock signal CP becomes active again.

One problem of the CML latch 100 is that it is only usable when the differential clock signals CP and CN are active. The high switching frequency of these clock signals precludes them from being supplied to the CML latch by any means other than internal generation on an integrated circuit ("IC") or chip which incorporates the CML latch or on a card to which the chip is mounted. Signals cannot be propagated through the CML latch unless the differential clock signals are present.

However, it is desirable to test chips which include CML latches at times when it is not possible to supply the differential clock signals CP and CN to the latches.

SUMMARY OF THE INVENTION

In accordance with an embodiment of the invention, a method of testing connectivity through a plurality of dual purpose current mode logic ("CML") latch circuits connected in a series is provided. Each of the CML latch circuits are operable to latch at least one output signal at a timing in accordance with at least one clock signal and having a mode control device for operating the CML latch circuit as a buffer amplifier when the at least one clock signal is inactive. The method comprises the steps of activating the mode control devices of each of the CML latches to operate each of the CML latches as a buffer; inputting a first signal to a first CML latch of the series; latching an output signal of a second CML latch of the series, the second CML latch being connected at a point in the series downstream from the first CML latch; and determining whether the output signal changes in accordance with a change in the first signal.

DETAILED DESCRIPTION

A dual purpose current mode logic ("CML") latch circuit in accordance with an embodiment of the invention includes a CML latch and a mode control circuit. The CML latch is operable to receive a pair of differential input data signals and a pair of differential clock signals and is operable to generate at least one output signal in accordance with the states of the pair of differential input data signals. A mode control signal is applied to the mode control circuit which determines whether the CML latch operates as a latch or as a buffer. Thus, when the clock signal is present, the CML latch can be operated in a normal operational mode to generate and latch the output signal in accordance with the differential input data signals that are applied to it at a timing determined by the clock signal. On the other hand, when the clock signal is not present, a mode control signal can be activated for operating the CML latch circuit in a test mode. In such test mode, the CML latch generates the output signal in accordance with the state of the differential input data signals but operates like a buffer instead of a latch. When the CML operates as a buffer, the output signal changes whenever the states of the differential input data signals change.

Each of the CML latches described herein in accordance with the various embodiments of the invention has dual operational modes. In the first operational mode in which the clock signal is supplied to the CML latch, the CML latch latches the output signal at a timing determined by the state of the clock signal. In the second operational mode, the CML latch operates as a buffer during a test mode when the clock signal normally supplied thereto is absent. In this way, during production testing, the CML latch can be operated as a buffer while testing electrical continuity of circuits which include the dual mode CML latch. For example, the CML latch can be operated as a buffer during wafer-level or chip-level production testing prior to packaging the chip when it is technologically forbidding or inconvenient to supply a high switching frequency clock signal to the chip.

Figure 1:
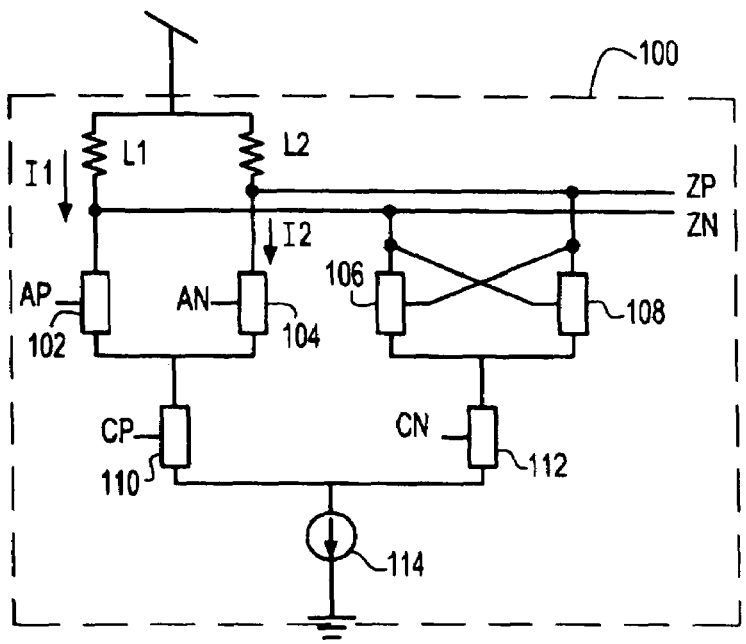
FIG. 1 is a schematic diagram illustrating a current mode logic ("CML") latch in accordance with the prior art.
Figure 2:
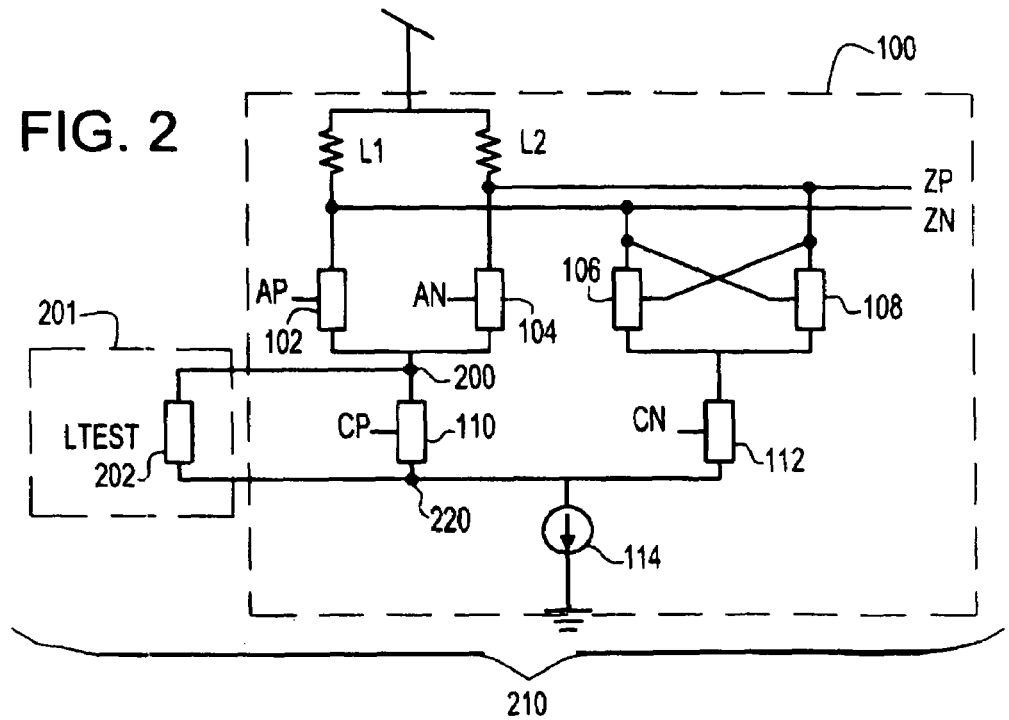
FIG. 2 is a schematic diagram illustrating a CML latch circuit in accordance with a first embodiment of the invention.

FIG. 2 is device-level schematic diagram illustrating a CML latch circuit 210 in accordance with an embodiment of the invention. As shown in FIG. 2, the CML latch circuit 210 includes a CML latch 100 such as that shown and described above with reference to FIG. 1. The CML latch circuit also includes a mode control circuit 201 including a mode control device 202 which is connected in parallel with the first tail device 110 of the CML latch. In the particular example shown in FIG. 2, the mode control device 202 is connected between a first node 200 and a second node 220, the second node 220 being directly connected to a current source 114. In such way, the mode control device provides an alternative path for the flow of current between the input devices 102, 104 and the current source 114, thus eliminating the need for a first differential clock signal CP to be provided to the first tail device. During a normal operational mode, an LTEST signal at the input to the mode control circuit is held inactive such that differential clock signals CP and CN provided to inputs of the first and second tail devices 110 and 112 control the operation of the CML latch 100. The second clock signal CN has the same clock frequency and the same voltage levels as the clock signal CP but is an inverted version of clock signal CP. While in the normal operational mode, during a first phase of a cycle of the differential clock signals, a first differential clock signal CP is active and a second differential clock signal CN is inactive. During the first phase of the differential clock cycle, the CML latch 100 begins to generate the output signals ZN and ZP in accordance with the signals AP and AN applied to input devices 102, 104. Subsequently, during a second phase of the differential clock cycle, the first differential clock signal CP is inactive and the second differential clock signal CN is active. During the second phase, the cross-coupled devices 106, 108 amplify the difference between the output signals ZN and ZP at that time and latch the states of the output signals until the first phase of the next differential clock cycle begins.

During a test mode of operation, the first and second differential clock signals are not supplied to the CML latch as input to the first and second tail devices 110, 112. Instead, the voltage or current at the second differential clock signal input CN at the input to the second tail device 112 is held constant at a level to maintain tail device 112 active. In addition, an active level is supplied at the LTEST signal input to the mode control circuit 201. The voltage or current at the input to the first differential clock signal input CP can be either left to float or held constant in an inactive state. Under such conditions, the CML latch generates differential output signals ZP and ZN according to the states of the differential input signals AN and AP, respectively. It is not necessary for the differential clock signals CP and CN to be provided to the CML latch 100 at that time. The output signals ZP and ZN generated by the CML latch 100 change in accordance with the input signals AN and AP as quickly as the input devices 102, 104 and the cross-coupled devices 106, 108 are able to amplify the input signals AN and AP. Thus, during the first operational mode, the CML latch circuit 210 operates as a latch timed in accordance with the pair of differential clock signals CP and CN. Otherwise, during the test mode, the CML latch 210 operates as a buffer when the LTEST signal and a voltage or current provided at the CN input to the second tail device are held in the active state.

Figure 3:
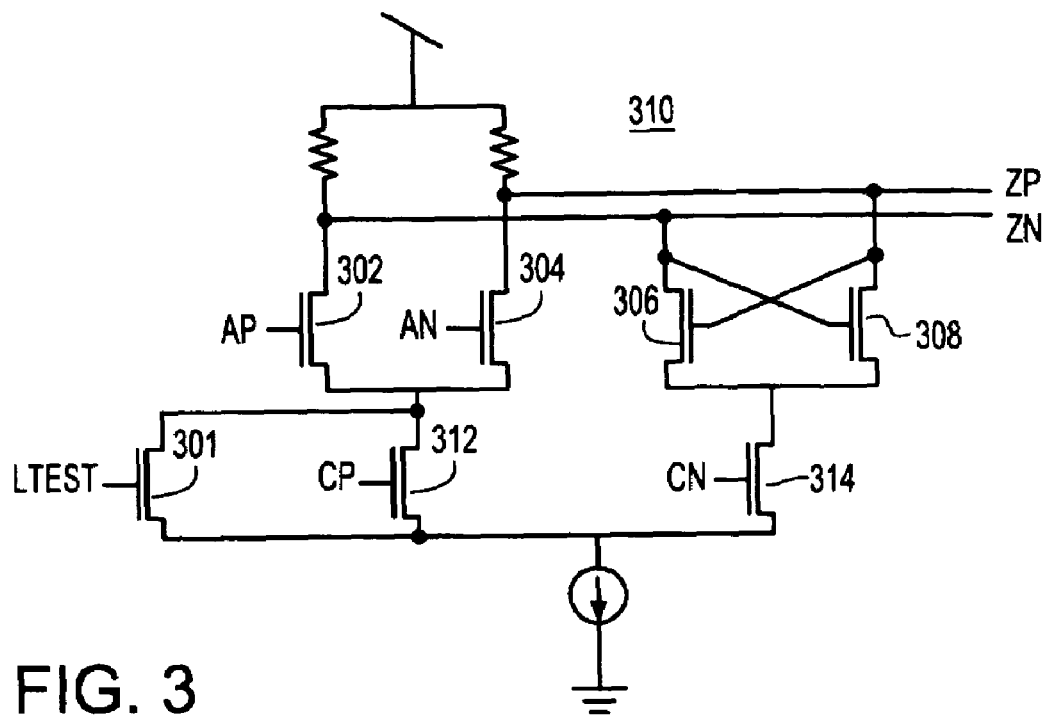
FIG. 3 is a schematic diagram illustrating a CML latch circuit in accordance with a particular embodiment of the invention in which active devices include n-type field effect transistors ("NFETs").

FIG. 3 illustrates a CML latch circuit 310 in accordance with a particular embodiment of the invention. This embodiment is the same as that described above with respect to FIG. 2, except that the mode control device 301, the input devices 302, 304, the cross-coupled devices 306, 308, and the tail devices 312 and 314 are specified to be n-type field effect transistors ("NFETs"). The input signals, output signals and operation of the CML latch circuit 310 are the same as that described above with respect to FIG. 2.

Figure 4:
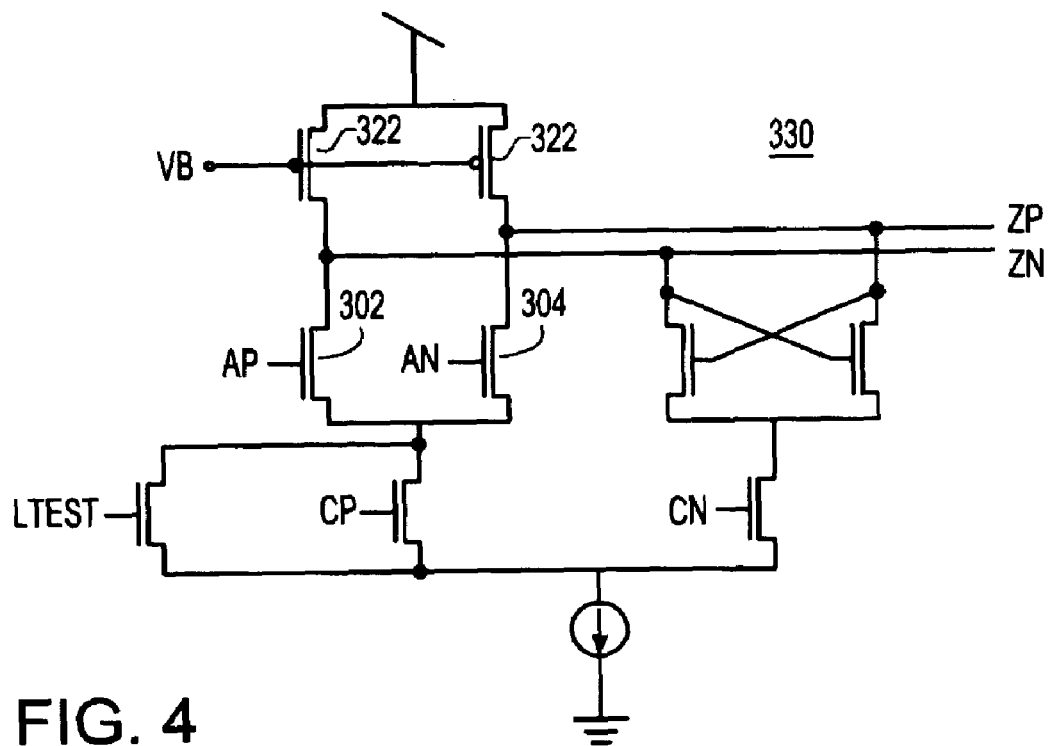
FIG. 4 is a schematic diagram illustrating a variation of the CML latch circuit shown in FIG. 3, in which active load devices are utilized in place of resistors.

FIG. 4 illustrates a CML latch circuit 330 according to a variation of the above-described CML latch circuit (310; FIG. 3). In such CML latch circuit 330, p-type field effect transistors ("PFETs") function as active load devices 320, 322, having drain terminals connected in conductive paths to drain terminals of the NFET input devices 302, 304. A bias voltage VB applied to the gates of the active load devices 302, 304 controls the conductivity of the load devices, and hence, the voltage drop across each of them according to the voltages of the respective input signals AP and AN applied to the input devices. The bias voltage can be held constant or modulated according to the operating conditions of the CML latch and the chip on which it is implemented. In a particular embodiment, the bias voltage VB is generated in accordance with a stable reference voltage such as a bandgap voltage and is applied to the load devices 320, 322 through a current mirroring arrangement. In such manner, the bias voltage may compensate for variations in the manufacturing process that affect the particular chip as well as changes in the operating environment such as temperature and operating loads.

Figure 5A:
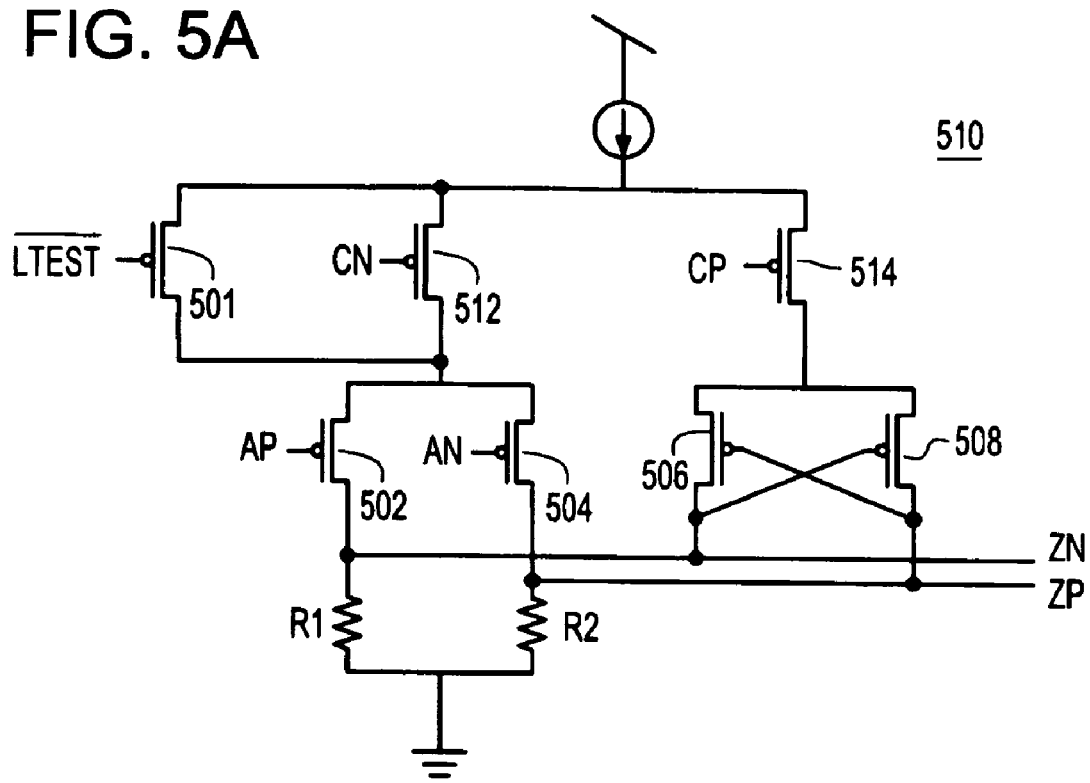
FIG. 5A is a schematic diagram illustrating a CML latch circuit in accordance with a particular embodiment of the invention in which active devices include p-type field effect transistors ("NFETs").

FIG. 5A illustrates a CML latch circuit 510 according to further variation of the above-described CML latch circuit 210. In this variation, p-type field effect transistors ("PFETs") are utilized as the mode control device 501, the input devices 502, 504, the cross-coupled devices 506, 508, and the tail devices 512 and 514. In contrast to the embodiment illustrated in FIG. 2, in this embodiment the clock signal CN is input to the tail device 512 which sources current to the input devices 502, 504. Clock signal CP is input to the tail device 514 which sources current to the cross-coupled devices 506, 508. Operation of the CML latch circuit 510 is the same as that described above with respect to FIG. 2, noting that the input data signals AP, AN, the clock signals CN and CP and the /LTEST signal input thereto are active when at a lower voltage level rather than when at a higher voltage level.

Figure 5B:
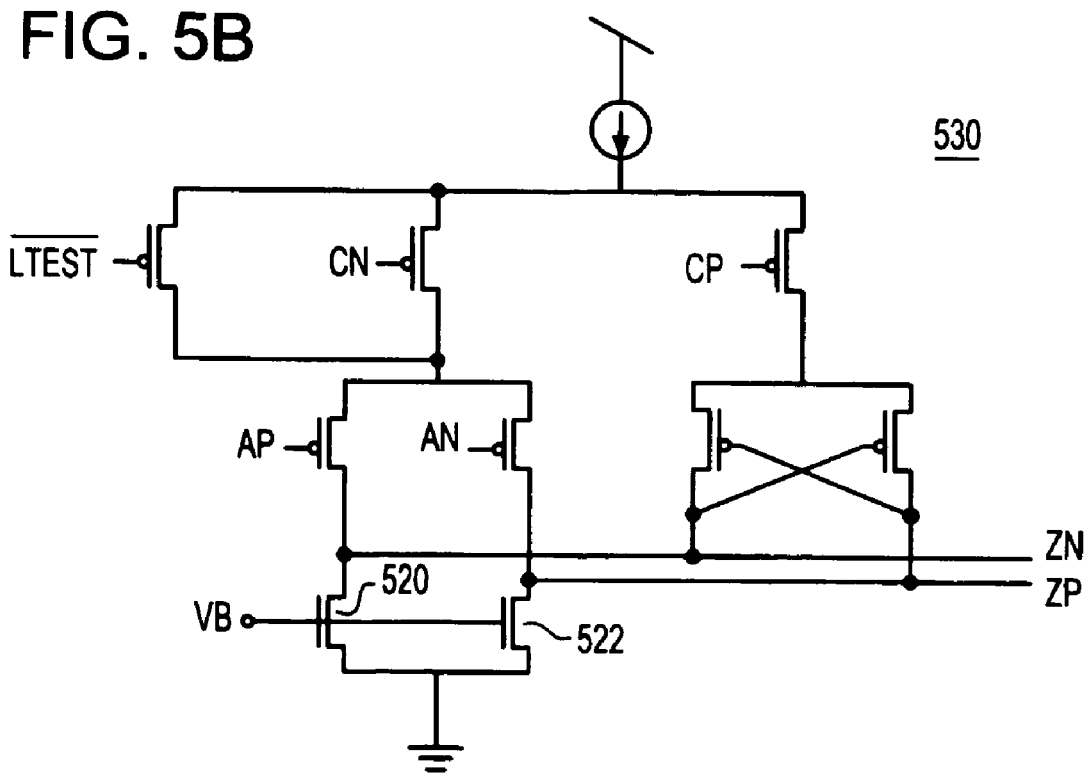
FIG. 5B is a schematic diagram illustrating a variation of the CML latch circuit shown in FIG. 5A, in which active load devices are utilized in place of resistors.

In a manner like that shown and described above with respect to FIG. 4, active load devices 520, 522 can also be utilized in the CML latch circuit 530 (FIG. 5B) in place of the resistors R1, R2 (FIG. 5A).

Figure 6A:
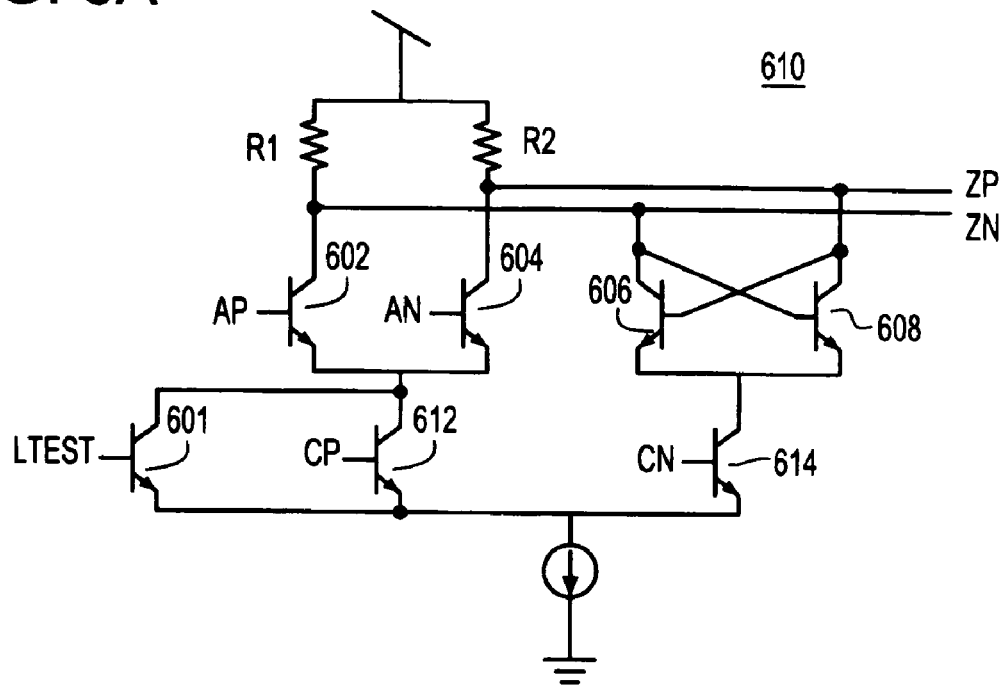
FIG. 6A is a schematic diagram illustrating a CML latch circuit in accordance with a particular embodiment of the invention in which active devices include npn type bipolar transistors.
Figure 6B:
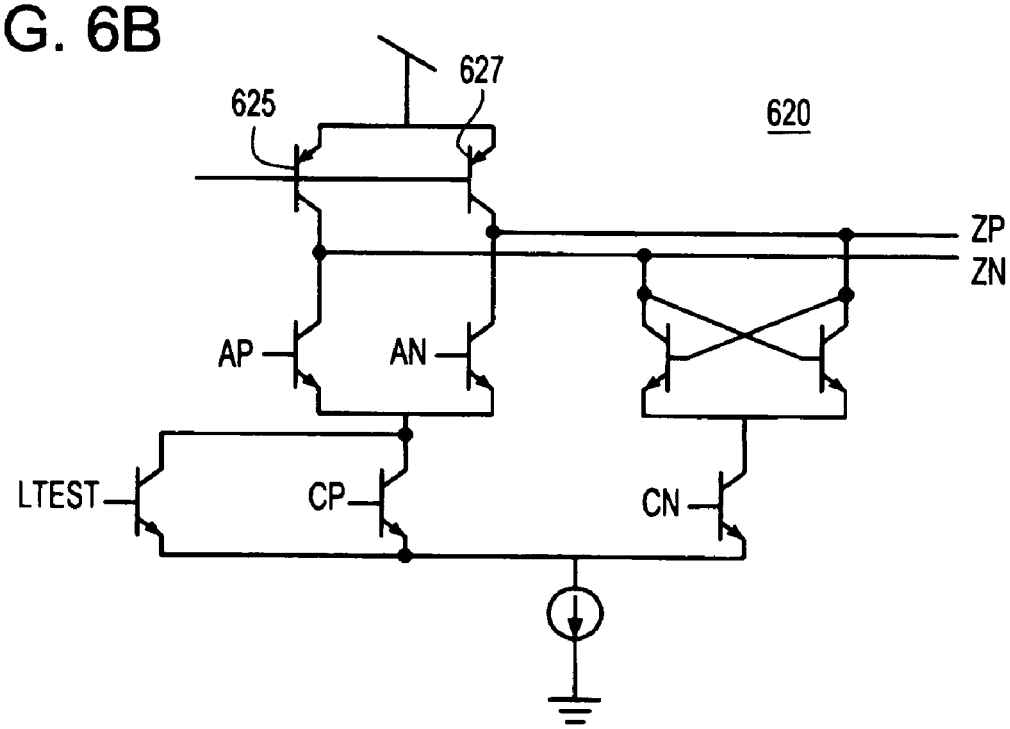
FIG. 6B is a schematic diagram illustrating a variation of the CML latch circuit shown in FIG. 6A, in which active load devices are utilized in place of resistors.

FIG. 6A illustrates a CML latch 610 circuit according to yet another variation in which each of the mode control device 601, input devices 602, 604 and cross-coupled devices 606, 608 and tail devices 612, 614 of a are implemented as npn-type bipolar transistors. Operation is the same or similar to that described above with respect to the NFET embodiment 310 illustrated in FIG. 3. In a CML latch circuit 620 (FIG. 6B) according to a variation of the embodiment shown in FIG. 6A, pnp type active load devices 625, 627 or other appropriate active load devices are utilized in place of the load resistors R1 and R2.

Figure 6C:
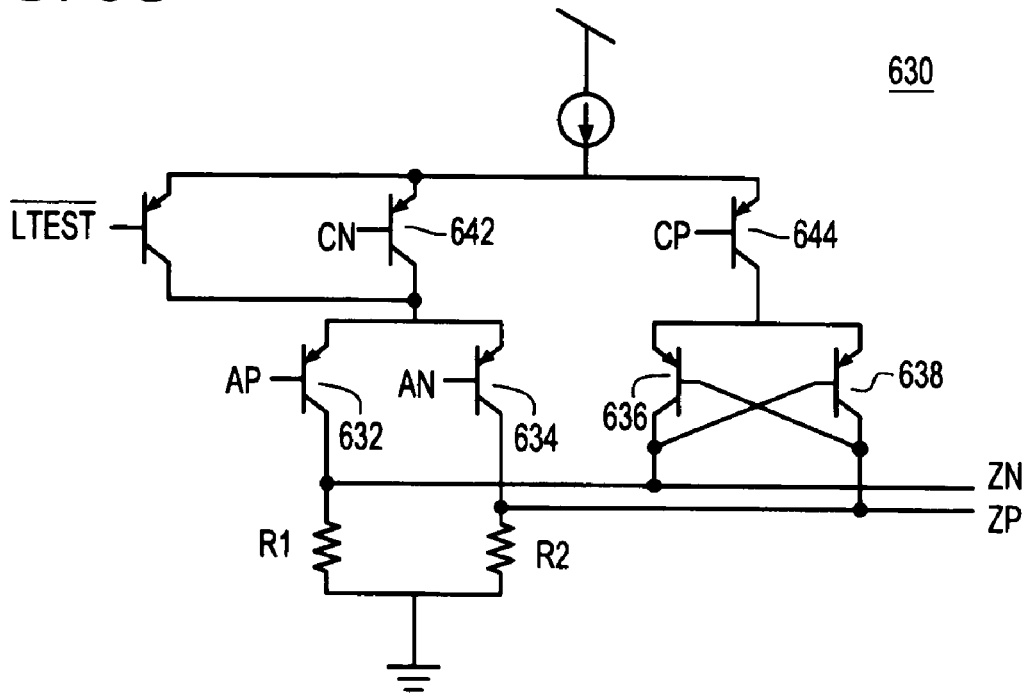
FIG. 6C is a schematic diagram illustrating a CML latch circuit in accordance with a particular embodiment of the invention in which active devices include pnp type bipolar transistors.
Figure 6D:
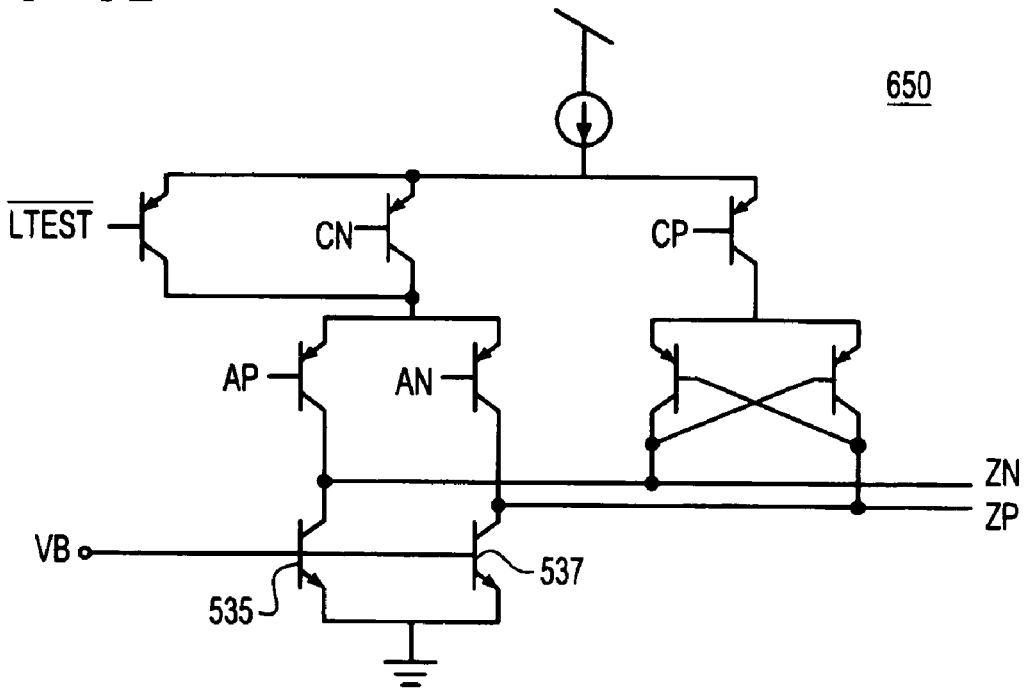
FIG. 6D is a schematic diagram illustrating a variation of the CML latch circuit shown in FIG. 6C, in which active load devices are utilized in place of resistors.

FIG. 6C illustrates a CML latch circuit 630 according to a further variation in which each of the mode control device 631, input devices 632, 634 and cross-coupled devices 646, 648 and tail devices 642, 644 are implemented as pnp-type bipolar transistors. Operation is similar if not functionally nearly the same as that described above with respect to the PFET embodiment 510 illustrated in FIG. 5A. In a CML latch circuit according to a further variation 650 (FIG. 6D), npn type active load devices 535, 537 or other appropriate active load devices are utilized in place of the load resistors R1 and R2.

Figure 7:
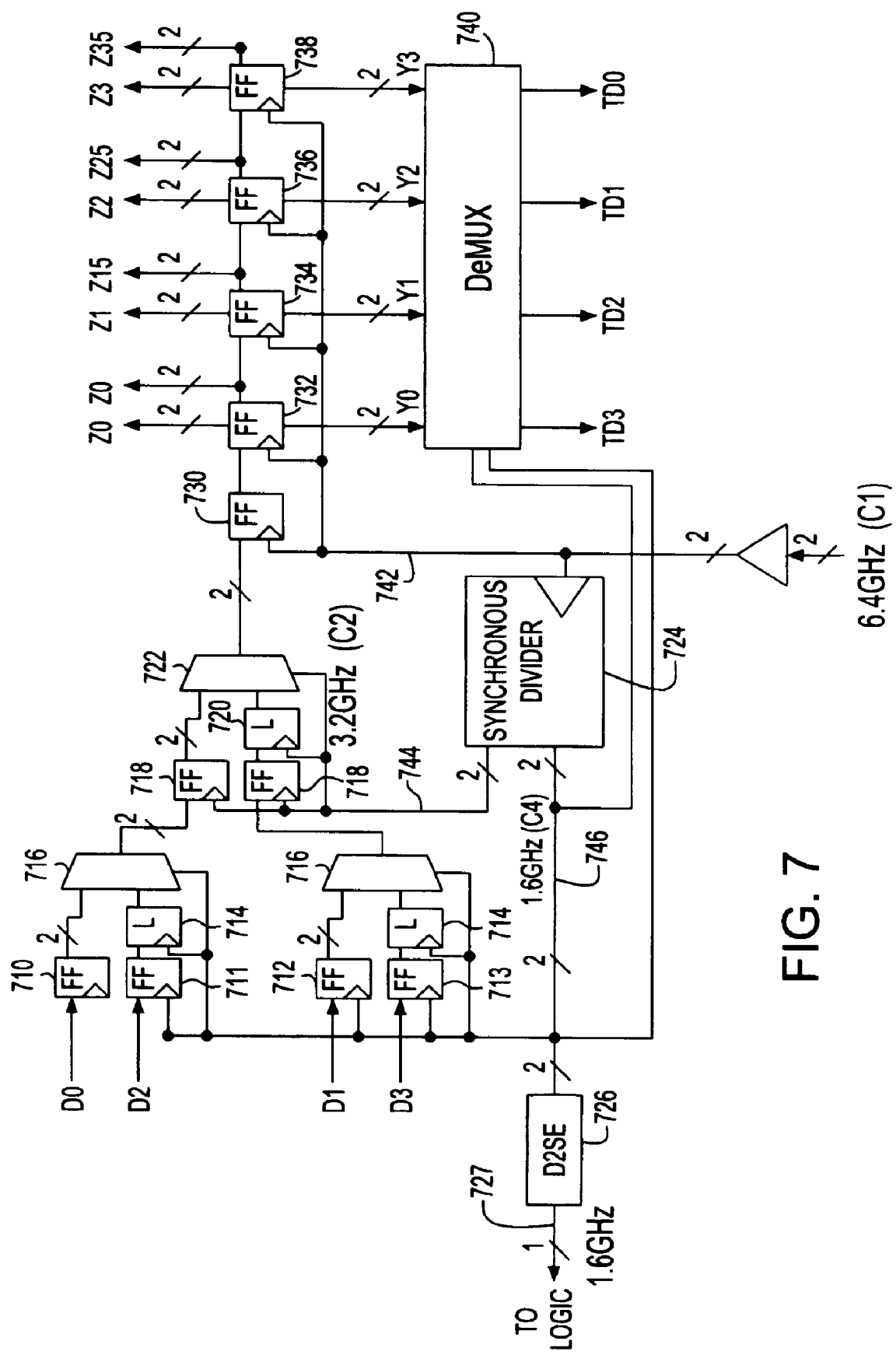
FIG. 7 is a block and schematic diagram illustrating a serializer circuit including a plurality of CML latches in accordance with an embodiment of the invention, as operated in a normal operational mode.

FIG. 7 is a block and schematic diagram illustrating a serializer circuit 700 in accordance with a further embodiment of the invention. The serializer circuit incorporates CML latch circuits in accordance with any one or more of the embodiments described above with respect to FIGS. 2 through 6D. Specifically, each of the flip-flops and latches in the serializer circuit 700 includes a CML latch according to one of the above-described embodiments. The serializer circuit 700 is used to convert a stream of parallel data into a serial data stream, such as for the purpose of transmitting data over a serial data transmission link. One bit data signals D0, D1, D2 and D3 are input to respective ones of the flip-flops 710, 711, 712 and 713, each of the flip-flops including a CML latch in accordance with one of the embodiments described above with reference to FIGS. 2 through 6D. The output of certain flip-flops 711 and 713 are input to latches 714, which themselves are CML latch circuits having a structure and operating in accordance with one of the embodiments described above with reference to FIGS. 2 through 6D.

In an example of operation, a full rate clock signal (C1) including a pair of differential clock signals is input to the serializer 700 at a frequency of 6.4 GHz and is buffered and supplied to the serializer circuit as the differential pair of clock signals 742. A synchronous divider 724 divides that clock frequency in half to 3.2 GHz for input as a differential pair of clock signals to second stage flip-flops 718, latch 720 and as a select signal to multiplexer 722. In addition, the synchronous divider 724 outputs another pair of differential clock signals 746 at a divided down clock frequency of 1.6 GHz. This pair of differential clock signals provides the CP and CN clock inputs to first stage flip-flops 710, 711, 712, and 713. A clock converter circuit 726 converts the divided down differential clock signal 746 to a single-ended clock signal 750 at the same frequency (1.6 GHz) for output to rail-to-rail logic circuits on the chip, for example CMOS logic circuits. The rail-to-rail logic circuits utilize the divided down single-ended clock signal 727 for control of sequential logic circuits, including logic circuits which produce the input data signals D0, D1, D2 and D3. The data signals D0, D1, D2 and D3 preferably are single-ended and the flip-flops 710, 711, 712 and 713 convert these single-ended data signals to respective pairs of differential signals, As timed by the pair of differential clock signals 746, the flip-flops 710, 711, 712, 713 latch the input data signals D0, D2, D1 and D3, respectively, into the serializer 700 as pairs of differential data signals. In addition, the pair of differential clock signals 746 are input as a select signal to the multiplexers 716 in the first stage of the serializer circuit 700.

One of the multiplexers 716, operated by a clock signal 750, selects alternating ones of data bits D0 and 10 D2 input thereto through flip-flops 710, 711 and latch 714, and another one of the multiplexers 716 selects alternating ones of the data bits D1 and D3 input thereto through flip-flops 712, 713 and latch 714. The output of the multiplexers 716 are input through flip-flops 718 and latch 720 to a further multiplexer 722 that operates with the differential pair 744 of clock signals at twice the rate of the clock signal 750 supplied to the multiplexers 716. Finally, the data output by multiplexer 722 is latched by the pair 742 of differential clock signals into a series of serially connected flip-flops 730, 732, 734, 736 and 738 at the final (undivided) clock rate to obtain the serialized data signal.

Each of the flip-flops 732, 734, 736, and 738 in the series includes two latches so as to produce two outputs, each output as a pair of differential signals. Each of the outputs of the flip-flops is delayed by 0.5 cycles of the differential clock in relation to one other output of the series of flip-flops, except for the output Z0 of flip-flop 732 which is the first output in the series. Thus, output Z05 is delayed by 0.5 cycles of the differential clock in relation to output Z0 and output Z1 is delayed by 0.5 cycles of the differential clock in relation to output Z05, and so on among all the outputs of the flip-flops 732. In such way, the outputs Z0, Z05, Z1, Z15, Z2, Z25, Z3 and Z35 of the flip-flops are taps of a tapped delay line. These taps are provided to a finite impulse response ("FIR") transmitter, which in turn, is used to shape the serialized data stream signal for transmission over a serial data transmission link (not shown).

During a particular mode of operation, a demultiplexer 740 also receives outputs Y0, Y1, Y2 and Y3 of the flip-flops 732, 734, 736 and 738, respectively, these preferably being the same signals as provided at the outputs Z0, Z1, Z2 and Z3. The demultiplexer is operable to output four bits of parallel data at the original parallel clock signal rate (1.6 GHz) as wrap data during a particular test mode.

Figure 8:
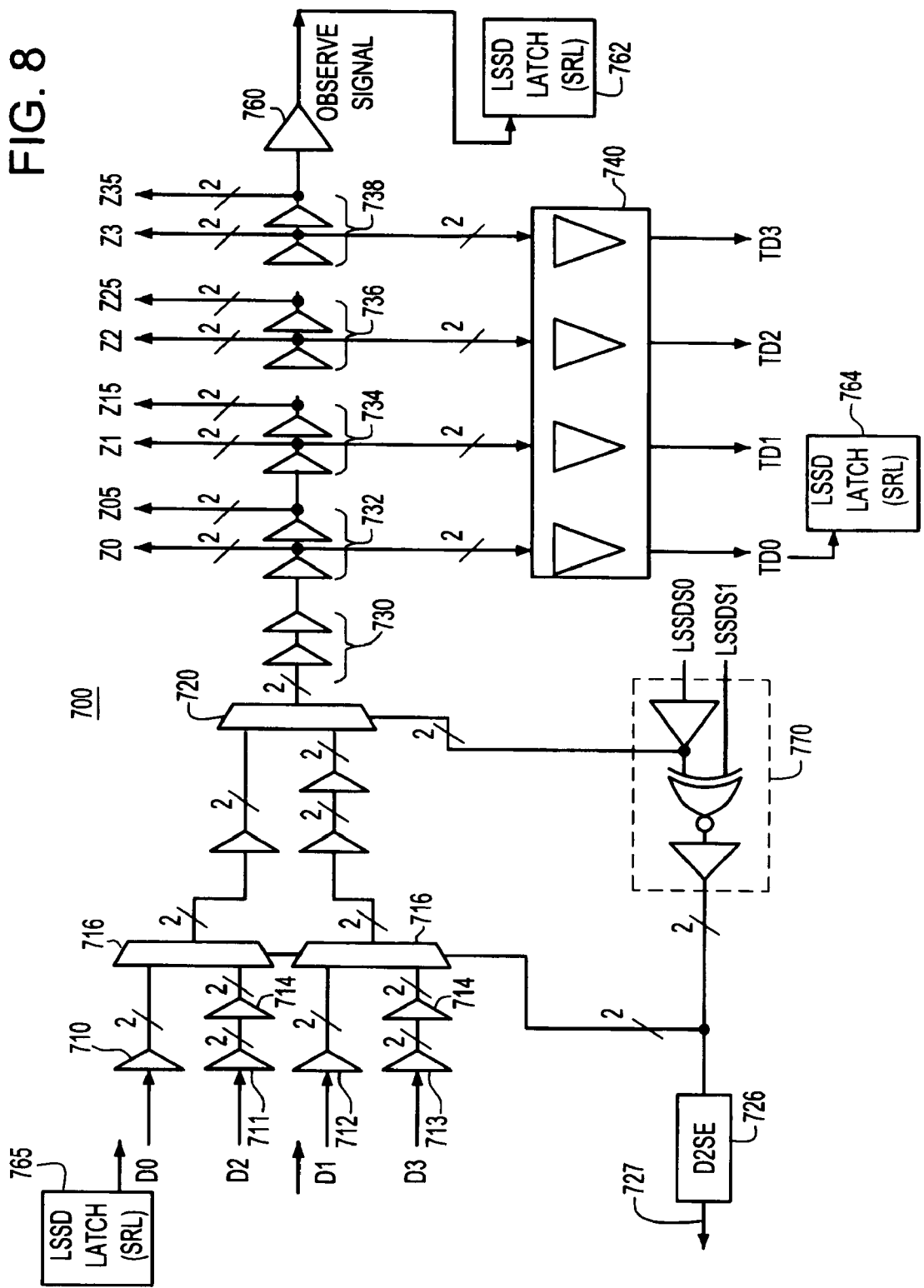
FIG. 8 is a block and schematic diagram illustrating operation of a serializer circuit in a test mode, the serializer circuit being arranged in accordance with the embodiment of the invention illustrated in FIG. 7.

During a test mode of the chip for performing continuity testing, the LSSD test signal is activated to each of the CML latches of the serializer circuit, in a manner as shown in FIG. 2, for example. Referring to FIG. 8, as a result, each of the CML latches, including each of the flip-flops and latches in the serializer circuit 700 now operates as a buffer or as a pair of series-connected buffers instead of a flip-flop or a latch. Each of the flip-flops 710, 711, 712, and 713 and latches 714 operates as a buffer. Each of the flip-flops 730, 732, 734, 736 and 738 operates as a pair of series-connected buffers.

During the test mode of operation, a latch, preferably a "level sensitive scan device" (LSSD) latch 765, also referred to as a "shift register latch" (SRL), provides a data bit signal at the input to the serializer circuit 700. In place of the clock signal, a pair of select signals LSSDS0 and LSSDS1 are input to the serializer for selecting a particular one of the digital bits D0, D1, D2 or D3 to be passed between the input and the output of the serializer circuit. After modification by logic 770 and/or the converter circuit 726, these select signals LSSDS0 and LSSDS1 are applied to the select inputs of the multiplexers 716 and 720. Thus, the LSSDS0 and LSSDS1 signals control the selection of signals through the multiplexers 716 and 720. Specifically, the digital bit that is selected by the multiplexers appears at the flip-flop 730 in accordance with the following truth table:

TABLE 1

Bit Selection Truth Table

| LSSDS0 | LSSDS1 | Bit |
|---|---|---|
| 0 | 0 | D3 |
| 0 | 1 | D1 |
| 1 | 0 | D0 |
| 1 | 1 | D2 |

Such signal propagates through the flip-flops 732, 734, 736 and 738 to an output of the serializer circuit through a final buffer 760 as an "observe signal" which is latched by an SRL latch 762. In addition, outputs of the flip-flops propagate through the demultiplexer 740 and are latched by an SRL latch 764.

While the CML latches are operated as buffers in the test mode, a signal applied as input to the serializer circuit at one of the data bit inputs D0 through D3 propagates through the serializer circuit without requiring a clock signal to be present. At that time, the states of the select signals LSSDS0 and LSSDS1 determine which of the data bit inputs D0 through D3 is passed through to the outputs through buffer 760 as the "observe" signal or through the demultiplexer 740.

While the invention has been described in accordance with certain preferred embodiments thereof, many modifications and enhancements can be made thereto without departing from the true scope and spirit of the invention, which is limited only by the claims appended below.

What is claimed is:

1. A method of testing connectivity, comprising:
  (a) operating a plurality of dual purpose current mode logic ("CML") latch circuits connected in a series with at least one multiplexer within the series receiving at least one clock signal as a selection input thereto for multiplexing parallel data into serial data, each of the CML latch circuits being operable to output a latched signal at a timing in accordance with the at least one clock signal and having a mode control device for operating the CML latch circuit as a buffer amplifier when the at least one clock signal is inactive;
  (b) activating the mode control devices of each of the CML latch circuits to operate each of the CML latches as a buffer amplifier;
  (c) applying a selection signal instead of the at least one clock signal to the selection input of the at least one multiplexer to select a first signal input to a first CML latch circuit in the series for propagation through a plurality of the CML latch circuits in the series operating as buffer amplifiers including a second CML latch circuit connected at a point in the series downstream from the first CML latch circuit;
  (d) latching a signal output by the second CML latch; and
  (e) determining whether the latched signal output by the second CML latch changes in accordance with a change in the first signal to determine whether there is a connection between the first and second CML latch circuits.

2. The method of testing connectivity as claimed in claim 1, wherein each of the CML latch circuits in the series further includes:
  a first input device operable to receive a first differential signal of a differentially transmitted pair of signals;
  a second input device operable to receive a second differential signal of the differentially transmitted pair of signals, the first and second input devices being operable to generate at least one secondary signal in response to the state of the first and second differential signals;
  a pair of cross-coupled devices operable to amplify the at least one secondary signal and maintain the state of the at least one secondary signal as the latched signal output by the CML latch circuit;
  a first tail device operable to receive a first clock signal of a differentially transmitted pair of clock signals to control a first current for powering the first and second input devices; and
  a second tail device operable to receive a second clock signal to control a second current for powering the pair of cross-coupled devices.

3. The method of testing connectivity as claimed in claim 2, wherein each of the first and second input devices includes a field effect transistor and each device of the pair of cross-coupled devices includes a field effect transistor.

* * * * *